(12) United States Patent
Essert et al.

(10) Patent No.: US 7,494,389 B1
(45) Date of Patent: Feb. 24, 2009

(54) PRESS-FIT-CONNECTION

(75) Inventors: Mark Essert, Lippstadt (DE); Martin Knecht, Erwitte (DE); Alexander Ciliox, Moehnesee (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/045,409

(22) Filed: Mar. 10, 2008

(51) Int. Cl.
*H01R 9/24* (2006.01)
(52) U.S. Cl. .......................... 439/884; 439/68; 257/692
(58) Field of Classification Search ............. 439/68–73, 439/884–887; 257/678, 690–692, 734
See application file for complete search history.

(56) References Cited

U.S. PATENT DOCUMENTS

| | | | | |
|---|---|---|---|---|
| 5,556,038 A | * | 9/1996 | Nakamura et al. ............. 241/17 |
| 5,695,348 A | * | 12/1997 | Legrady ...................... 439/78 |
| 6,276,946 B1 | * | 8/2001 | Stephan ....................... 439/83 |
| 6,634,911 B1 | * | 10/2003 | Billman et al. .............. 439/884 |
| 7,168,963 B2 | * | 1/2007 | Minich et al. ................. 439/79 |
| 7,195,495 B2 | * | 3/2007 | Takano et al. ................. 439/74 |
| 7,303,401 B2 | * | 12/2007 | Schell et al. .................. 439/65 |
| 7,422,447 B2 | * | 9/2008 | Daily et al. ................... 439/83 |

* cited by examiner

*Primary Examiner*—Khiem Nguyen
(74) *Attorney, Agent, or Firm*—Coats & Bennett, P.L.L.C.

(57) ABSTRACT

According to an embodiment, a press-fit connector includes a first part with a first end and with a second end, and a second part with a first end and with a second end. The second end of the first part is electrically and mechanically joined to the first end of the second part. The first part is made of a first material with a first mechanical strength. The second part is made of a second material with a second mechanical strength. The first mechanical strength is greater than the second mechanical strength.

9 Claims, 4 Drawing Sheets

PRESS-FIT-CONNECTION

FIELD OF TECHNOLOGY

The invention relates to press-fit connectors.

BACKGROUND

Press-fit connectors serve for electrically and mechanically connecting electronic devices, e.g. power semiconductor modules, with other electronic components.

SUMMARY

A first aspect of the invention relates to a press-fit connector comprising a first part with a first end and with a second end, and a second part with a first end and with a second end. The second end of the first part is electrically and mechanically joined to the first end of the second part. Further on, the first part is made of a first material with a first mechanical strength and the second part is made of a second material with a second mechanical strength, whereby the first mechanical strength is greater than the second mechanical strength.

A second aspect of the invention relates to a power semiconductor module comprising such a press-fit connector, and a circuit carrier with a metallization.

A third aspect of the invention relates to a method for manufacturing a power semiconductor module comprising such a press-fit connector, and a circuit carrier with a metallization.

BRIEF DESCRIPTION OF THE DRAWINGS

The invention can be better understood with reference to the following drawings and the description. The components in the figures are not necessarily to scale, instead emphasis being placed upon illustrating the principles of the invention. Moreover, in the figures, like reference numerals designate corresponding parts. In the drawings:

FIG. 1 shows a press-fit connector comprising a first part 1 and a second part 2. The first part 1 has a first end 11 and a second end 12, the second part 2 a first end 21 and a second end 22. To form a press-fit connector suitable for use in a power semiconductor module, the second end 12 of the first part 1 is electrically and mechanically joined with the first end 21 of the second part 2.

Figure 1:
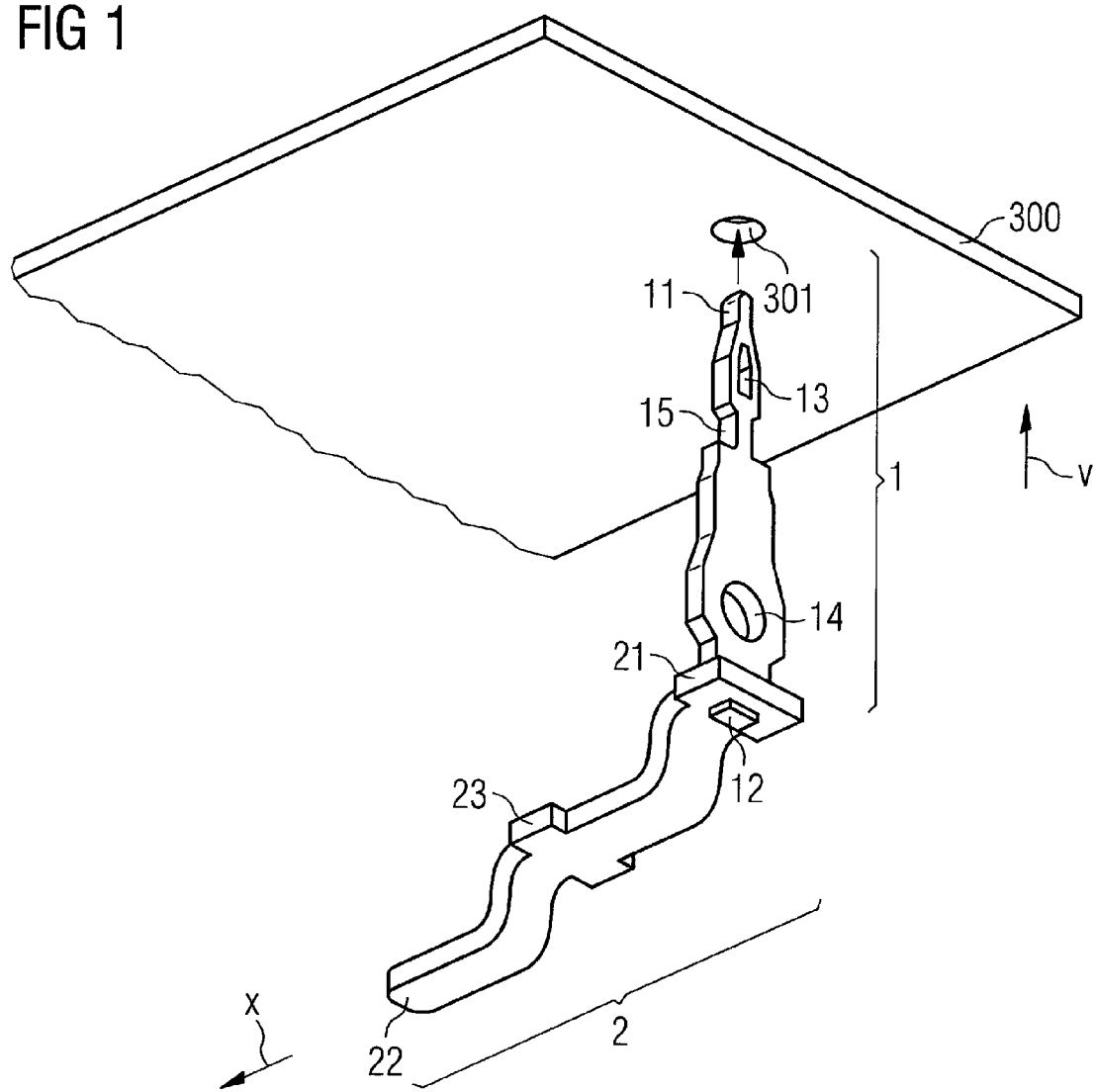
FIG. 1 illustrates a press-fit connector comprising two parts joined with each other, and an electronic component comprising an opening in which an end of the press-fit connector is to be pressed into.

Joining the second end 12 of the first part 1 with the first end 21 of the second part 2 may be effected by welding or by soldering. Alternatively or additionally, the joint between the second end 12 of the first part 1 and the first end 21 of the second part 2 may be formed as form-locked connection and/or as substance-to-substance connection.

The first end 11 of the first part 1 is designed to be pressed into an opening 301 of an electronic component 300, e.g. a strip line or a circuit carrier, such that a stable mechanical and electrical connection having little ohmic resistance is formed. Hence, a certain mechanical strength of the first part 1 is required to avoid damaging the first part 1, in particular its first end 11, when pressing the first end 11 into the opening 301.

The second end 12 of the second part 2 is intended to electrically contact a further electronic component, e.g. the metallization of an insulating substrate of a power semiconductor module. The second part 2 may serve to electrically connect the first part 1 with a further electric component, e.g. a metallization of a substrate of a power semiconductor module. Due to the different materials used for manufacturing the first part 1 and the second part 2, the first part 1, which may have a lower thermal conductivity than the second part 2, limits the heat flow from the power module to the mounted electronic component 300.

Due temperature stress load, shrinking processes of the used materials etc., mechanical tensions may appear. As such mechanical tensions may affect the connection between the electronic component 300 and the further electronic component, the first part 2 has a comparatively low strength and therefore is able to compensate for mechanical tensions.

In other words, the first part 1 is made of a first material which has a first mechanical strength. Accordingly, the second part 2 is made of a second material which has a second mechanical strength, whereby the first mechanical strength is greater than the second mechanical strength. For example, the first material may be CuSn6 or CuSn8 or CuFe2P, the second material may be, e.g., copper or a copper alloy.

In particular, the second material may have a tensile strength ranging from, e.g., 200 N/mm$^2$ to 250 N/mm$^2$, from 250 N/mm$^2$ to 300 N/mm$^2$ or from 300 N/mm$^2$ to 370 N/mm$^2$. The tensile strength of the second material may also be greater than or equal to 370 N/mm$^2$.

In FIG. 1, the first end 21 of the second part 2 comprises an opening into which the second end 12 of the first part 1 is inserted. Vice versa, the second end 12 of the first part 1 may comprise an opening, into which the first end 21 of the second part 2 is inserted. After insertion, the second end 12 of the first part 1 and the first end 21 of the second part may be bonded to each other substance-to-substance, e.g. by soldering or welding. Additionally or alternatively to a substance-to-substance bond, the second end 12 of the first part 1 and the first end 21 of the second part may be joined form-locked.

To improve the connectibility and the connection between the first end 11 of the first part 1 and the opening 301 of the electronic component 300, the first end 11 of the first part 1 may optionally comprise a free end, towards which the first end 11 tapers. At its first end 11, the first part 1 may comprise a hutch 13 which purposeful allows for deforming the first end 11 when being inserted into the opening 301. Further, the first end 11 of the first part 1 may comprise a notch 15 which prevents the first end 11 from slipping out of the opening 301.

In FIG. 1, the first part 1 comprises an optional opening 14 which improves anchorage of the first part 1, e.g. in a cast housing frame of a power semiconductor module, if that section of the first part 1 comprising the opening 14 and the opening 14 itself is embedded in the housing frame. Such an opening 14 may be arranged between the notch 1 and the second end 12 of the first part 1, and/or between the hutch 13 and the second end 12 of the first part 1. Between its first end 21 and its second end 22, the second part 2 comprises a broadening 23 which enables fixing the second part 2 during the cast process of the housing frame of the module.

After joining the first part 1 and the second part 2, the first end 11 of the first part 1 runs in a first direction v and the second end 22 of the second part 2 runs in a second direction x. According to one possible embodiment of the invention, the first direction v runs perpendicular to the second direction x, i.e. the first end 11 of the first part 1 and the second end 22 of the second part 2 run perpendicular to one another. Alternatively, the first end 11 of the first part 1 and the second end 22 of the second part 2 may include any other angle different from 90°.

Figure 2:
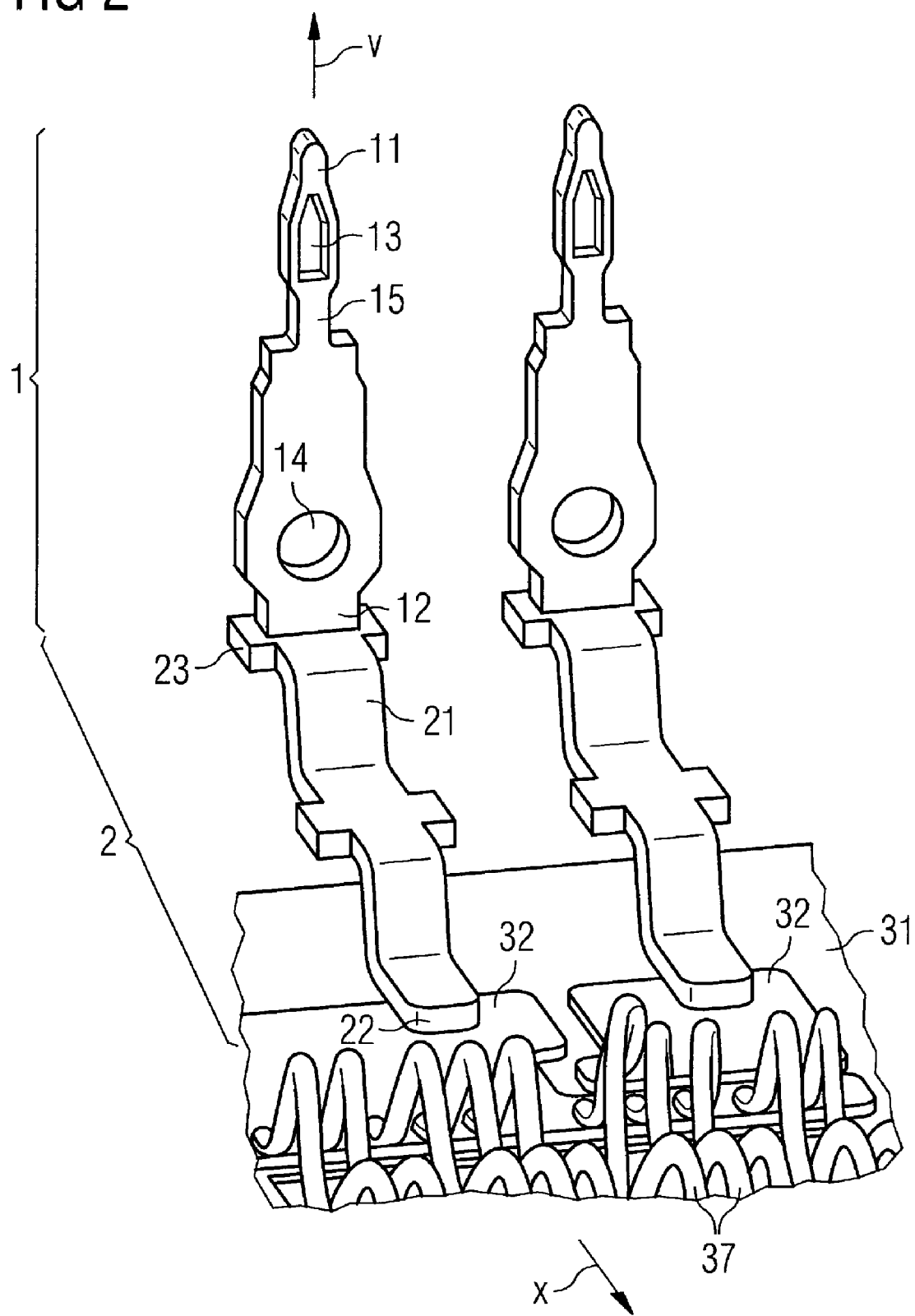
FIG. 2 illustrates two press-fit connectors as shown in FIG. 1, which are mechanically and electrically joined with a metallization of a circuit carrier.

In FIG. 2, two press-fit connectors which may be designed as described above, are mechanically and electrically joined with a structured metallization 32 of a substrate 31 of a power semiconductor module. The joints may be formed, e.g., by welding, soldering, bonding or conductive gluing the second ends 22 of the second parts 2 to the metallization 32. The substrate 31 may be made from insulating material, for example ceramics, e.g. aluminum oxide $Al_2O_3$ or aluminum nitride AlN or silicon nitride $Si_3N_4$. The metallization may be, e.g., made of copper or of aluminum or of an alloy substantially comprising at least one of these materials. FIG. 2 additionally shows a number of bonding wires 37 connection the metallization 32 with other components of the power semiconductor module.

Figure 3:
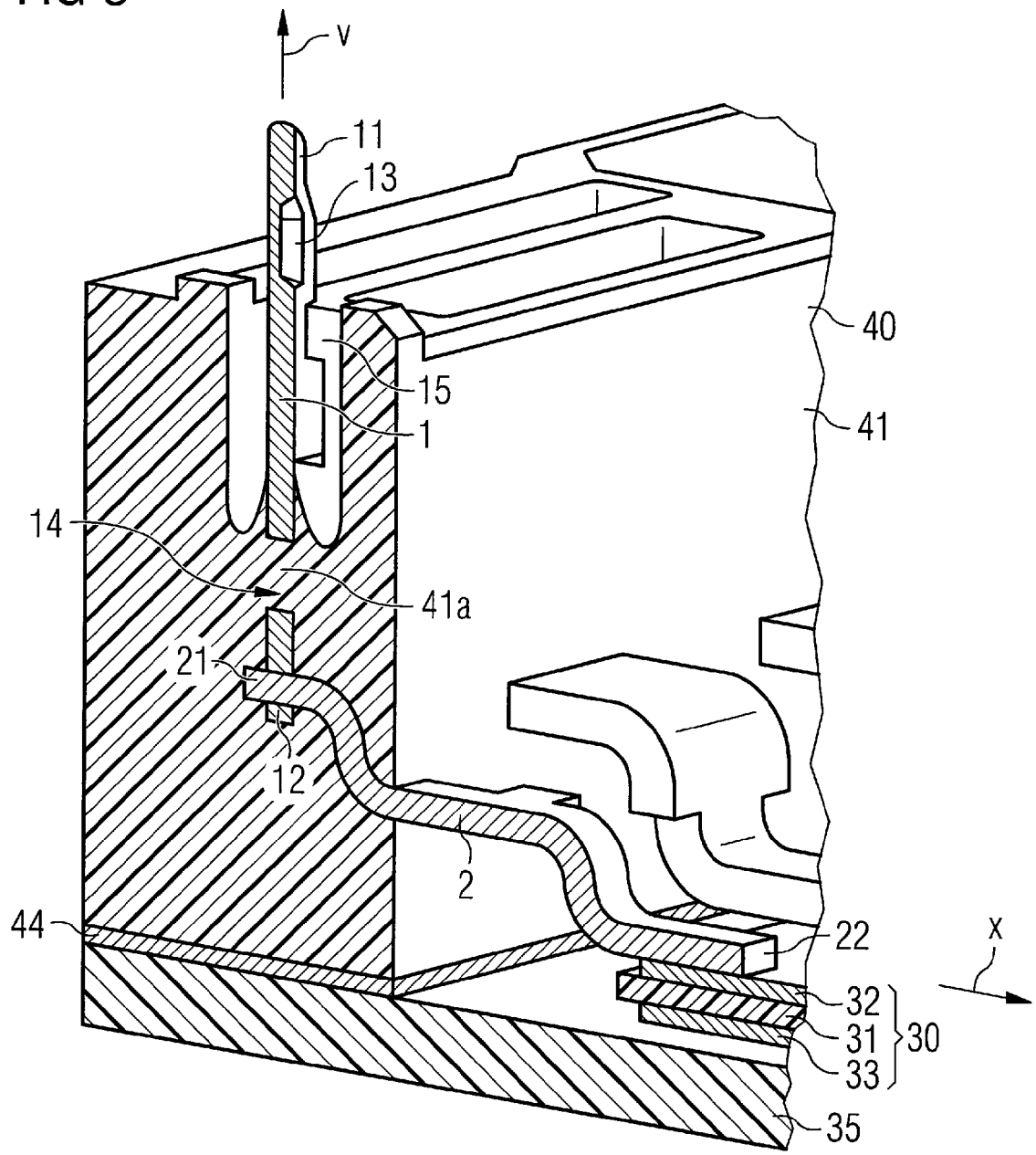
FIG. 3 is a vertical cross-sectional view of a section of a power semiconductor module comprising a cast housing frame, with which a press-fit connector as shown in FIGS. 1 and 2 is cast integral.

FIG. 3 is a vertical cross-sectional view of a section of a power semiconductor module comprising a cast housing 40 with a side wall 41, and a circuit carrier 30 having a substrate 31 with a structured top metallization 32 and an unstructured bottom metallization 33. For example, the circuit carrier 30 may be designed as DCB-substrate (DCB=Direct Copper Bonding), or as PCB (PCB=Printed Circuit Board). The circuit carrier 30 may be arranged on the top surface of a base plate 35 of the power semiconductor module.

Apart from joining it with a structured metallization 32 of a substrate 31, the second end 22 of the second part 2 may alternatively be joined with any other electric component of a power semiconductor module, e.g. with a metallization of a power semiconductor chip, or with a bus bar.

As can be seen from FIG. 3, the press-fit connector 1, 2 is partly cast integral with the side wall 41. For example, the joint between the second end 12 of the first part 1 and the first end 21 of the second part 2 is embedded in the housing frame 40. Alternatively or additionally, the opening 15 may be embedded in the housing frame 40. Thus, when casting the press-fit connector 1, 2 integral with side wall 41, a web 41a running through the opening 15 forms, thereby increasing the strength of the joint between the first part 1 and the side wall 41.

Instead of casting the press-fit connector 1, 2 integral with the housing frame 41, it is also possible to press the press-fit connector 1, 2 into a receiving area, e.g. a guide rail which may be formed integral with the housing frame. The press-fit connector 1, 2 may comprise an optional engagement element, e.g. an engagement hook or a hole, which is designed to engage into a corresponding engagement element of the housing frame.

Figure 4:
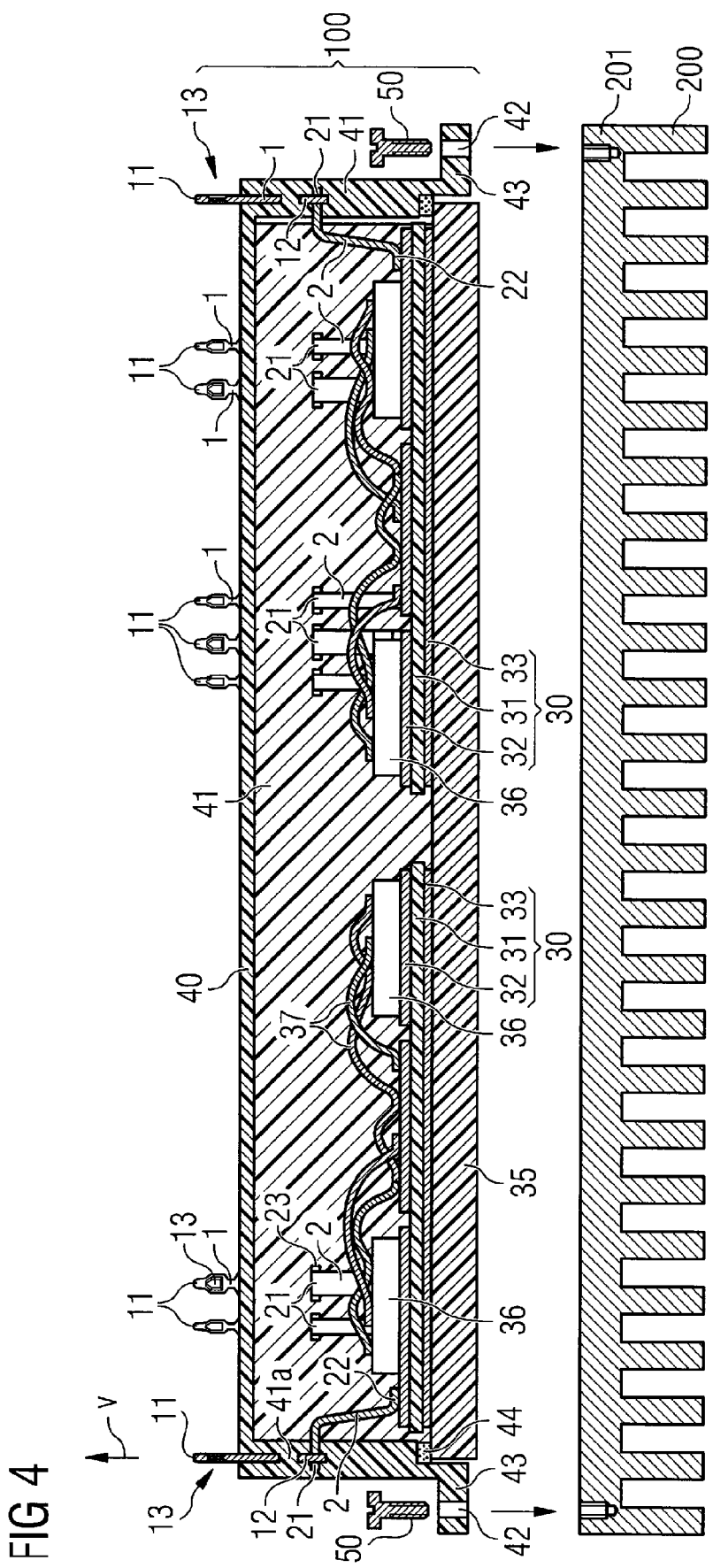
FIG. 4 is a vertical cross-sectional view of a complete power semiconductor module comprising a cast housing frame, with which a press-fit connector as shown in FIGS. 1 and 2 is cast integral.

FIG. 4 is a vertical cross-sectional view of a complete power semiconductor module comprising a cast housing with a housing frame 40 having side walls 41. A number of press-fit connectors 1, 2 as shown in FIGS. 1 and 2 is cast integral with the side walls 41. Depending on the required ampacity, different press-fit connectors 1, 2 may comprise different geometries, in particular different cross sectional areas.

The module further comprises a number of circuit carriers 30 which may be designed as described in FIG. 3. The circuit carriers 30 are soldered with their bottom metallizations 33 to a common base plate 35 of the module. On each of circuit carriers 30, at least one power semiconductor chip 36 may be arranged and connected, e.g. by wire bonding, soldering or conductive gluing, to the respective structured top metallization 32. As a part of the module wiring, a number of bonding wires 37, which connect respective components of the module, is provided.

The cast housing 40 comprises flanges 43 with screw holes 42 for screwing the module to a heat sink 200. After inserting screws 50 into the screw holes 42 and screwing them into respective threads 201 of the heat sink 200, the base plate 35 is pressed against the heat sink 200. An elastic sealing 44 is arranged between the cast housing 40 and the base plate 35 spreads the pressure of the cast housing 40 effecting the base plate 35. Optionally, to improve the dielectric strength of the module, its interior may be filled with an insulating soft pottant, e.g. a silicone gel.

Producing a power semiconductor module with at least one press-fit connector 1, 2 requires a step, in which an electrically conductive first part 1 with a first end 11 and with a second end 12, and an electrically conductive second part 2 with a first end 21 and with a second end 22 are provided.

The first part 1 is made of a first material with a first mechanical strength and the second part 2 is made of a second material with a second mechanical strength, whereby the first mechanical strength is greater than the second mechanical strength. The first end 11 of the first part 1 is designed to be pressed into an opening of an electronic component. A press-fit connector is produced by electrically and mechanically joining the second end 12 of the first part 1 and the first end 21 of the second part 2. Then, a cast housing frame 41 for a power semiconductor module is produced, thereby casting the press-fit connector 1, 2 partly integral with the housing frame 41.

Optionally, the second end 22 of the second part 2 may be mechanically and electrically joined with the metallization 32 of an insulating circuit carrier 31.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

The invention claimed is:

1. A power semiconductor module comprising
   a circuit carrier with a metallization; and
   a press-fit connector comprising a first part with a first end and with a second end, and a second part with a first end and with a second end, where
   the second end of the first part is electrically and mechanically joined to the first end of the second part;
   the first part is made of a first material with a first mechanical strength;
   the second part is made of a second material with a second mechanical strength;
   the first mechanical strength is greater than the second mechanical strength; and
   the second end of the second part is joined to the metallization.

2. The power semiconductor module of claim 1, where the second end of the second part is welded to the metallization.

3. The power semiconductor module of claim 1, where the first material is CuSn6 or CuSn8 or CuFe2P.

4. The power semiconductor module of claim 1, where the second material is a copper alloy.

5. The power semiconductor module of claim 1, where the tensile strength of the second material ranges from 200 N/mm$^2$ to 250 N/mm$^2$ or from 250 N/mm$^2$ to 300 N/mm$^2$ or from 300 N/mm$^2$ to 370 N/mm$^2$ or is greater than or equal to 370 N/mm$^2$.

6. The power semiconductor module of claim 1 comprising a cast housing frame, in which the joint between the second end of the first part and the first end of the second part is cast integral.

7. The power semiconductor module of claim 1 comprising a cast housing frame, whereby the first part comprises an opening which is embedded in the housing frame.

8. Method for manufacturing a power semiconductor module comprising the following steps:

Providing an electrically conductive first part with a first end and with a second end, and an electrically conductive second part with a first end and with a second end, the first part being made of a first material with a first mechanical strength and the second part being made of a second material with a second mechanical strength, whereby the first mechanical strength is greater than the second mechanical strength, and whereby the first end of the first part is designed to be pressed into an opening of an electronic component;

producing a press-fit connector by electrically and mechanically joining the second end of the first part and the first end of the second part;

producing a cast housing frame for a power semiconductor module, thereby casting the press-fit connector integral with the housing frame.

9. The method of claim 8 additionally comprising the steps of:

providing an insulating circuit carrier with a metallization; and mechanically and electrically joining the second end of the second part with the metallization.

* * * * *